US006946307B2

(12) United States Patent
Shih

(10) Patent No.: US 6,946,307 B2
(45) Date of Patent: Sep. 20, 2005

(54) METHOD AND SYSTEM FOR TESTING DRIVER CIRCUITS OF AMOLED

(75) Inventor: An Shih, Changhua (TW)

(73) Assignee: Toppoly Optoelectronics Corporation, Miao-Li (TW)

( * ) Notice: Subject to any disclaimer, the term of this patent is extended or adjusted under 35 U.S.C. 154(b) by 14 days.

(21) Appl. No.: 10/694,034

(22) Filed: Oct. 27, 2003

(65) Prior Publication Data

US 2004/0095301 A1 May 20, 2004

(30) Foreign Application Priority Data

Oct. 25, 2002 (TW) ....................................... 91124960 A

(51) Int. Cl.$^{7}$ ......................... G01R 31/26; H01L 21/66; H01L 21/00

(52) U.S. Cl. .............................. 438/17; 438/18; 438/28

(58) Field of Search .............................. 438/17, 18, 28; 385/84

(56) References Cited

U.S. PATENT DOCUMENTS

2002/0014851 A1 * 2/2002 Tai et al. ................. 315/169.3
2003/0076282 A1 * 4/2003 Ikeda et al. .................... 345/55
2004/0189559 A1 * 9/2004 Shih ............................ 345/84

* cited by examiner

*Primary Examiner*—William M. Brewster
(74) *Attorney, Agent, or Firm*—Snell & Wilmer L.L.P.

(57) ABSTRACT

A method and a system for testing circuits of an AMOLED before implantation of OLEDs are provided. Each circuit includes a terminal, connected to an OLED after the OLED is implanted, configured as a test point. The system selects one circuit to test. The method and the system extract a current signal from the test point, and then analyze it to determine the status of the circuit. The steps being repeated, all circuits of the AMOLED can be tested efficiently and precisely.

4 Claims, 7 Drawing Sheets

METHOD AND SYSTEM FOR TESTING DRIVER CIRCUITS OF AMOLED

CROSS-REFERENCE TO RELATED APPLICATION

This Application claims priority to Taiwan Patent Application No. 091124960 filed on Oct. 25, 2002.

FIELD OF INVENTION

The present invention provides a method and a system for testing circuits of an active matrix organic light emitting display (AMOLED) prior to implantation of organic light emitting diodes (OLEDs).

BACKGROUND OF THE INVENTION

As technology progresses, the manufacturing technique of monitor display is also progressing. After the technique of liquid crystal display (LCD), the newest technique of monitor display brought to the market is one that utilizes organic light emitting diodes (OLEDs). Each OLED requires a circuit to drive it to emit light. The light can be of either a single color, such as red, green or blue, or even multiple colors. The advantages of OLEDs are the flexibility, liberation from vision angle restriction, long product lifetime and low power consumption.

Each pixel of an active matrix OLED needs an OLED and a circuit. Therefore, there are ten thousands or even millions of circuits in one panel. It is a complicated task to test the normal functionality of all circuits in one panel. FIG. 1, FIG. 2 and FIG. 3 show the common circuits configured to drive OLEDs within monitor displays. Referring now to FIG. 1, FIG. 2 and FIG. 3, the method of prior art for testing these circuits is to enable each one via the write scan line WSL and to input a certain voltage level via the data line DL after OLEDs are implanted. The circuit transfers the voltage level into a current signal I which makes the OLED emit light. According to the voltage level, test engineers determine the OLED's functionality simply by observing its luminosity with eyes. Moreover, if a circuit fails the test, the OLED having been implanted in it is wasted and cannot be recovered even though the OLED itself may be perfect. Accordingly, this test method of prior alt would result in not only imprecision caused by the subjective decision of the test engineers but also high costs.

SUMMARY OF THE INVENTION

The present invention provides a method and a system to test the circuits within an AMOLED prior to implantation of OLEDs. The AMOLED includes an input panel, a write scan line and a data line.

The method of the present invention includes the following steps: assigning a value of a data signal to the write scan line, assigning a value of a selection signal to the data line to select a circuit for test, and extracting a signal from a test output terminal of the circuit.

The system of the present invention includes a data input device, a pixel selection device, and a signal extractor. The data input device is configured to input a data signal. The pixel selection device is configured to input a selection signal to select a circuit. The signal extractor, connected to the test output terminal of the circuit, is configured to extract the current signal.

DETAILED DESCRIPTION

Figure 1:
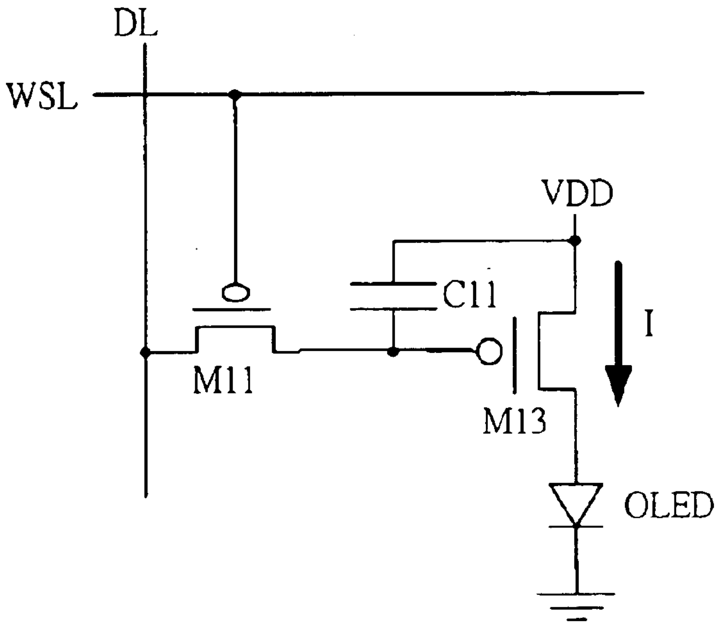
Fig. 1 (prior art)
FIG. 1 illustrates the first circuitry after implantation of an OLED.
Figure 2:
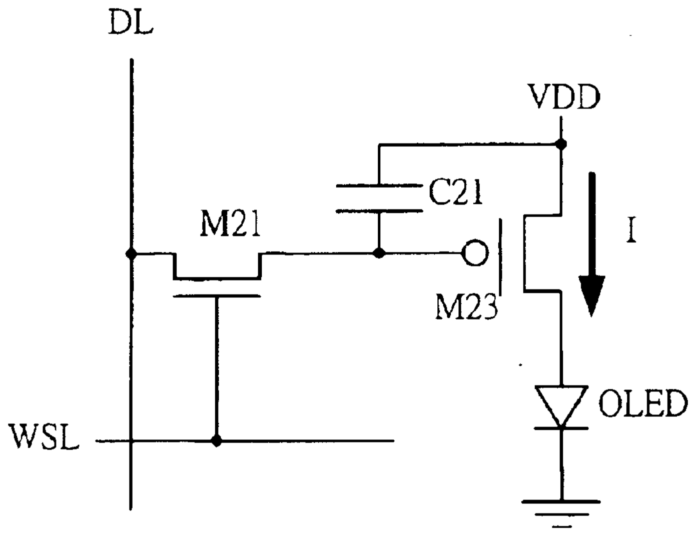
Fig. 2 (prior art)
FIG. 2 illustrates the second circuitry after implantation of an OLED.
Figure 3:
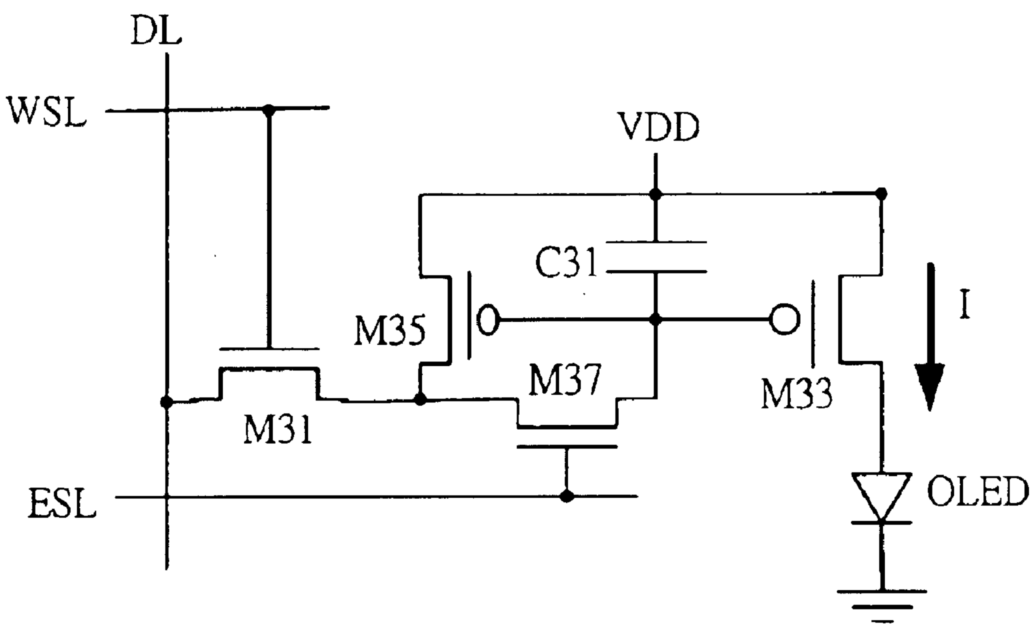
Fig. 3 (prior art)
FIG. 3 illustrates the third circuitry after implantation of an OLED.
Figure 4:
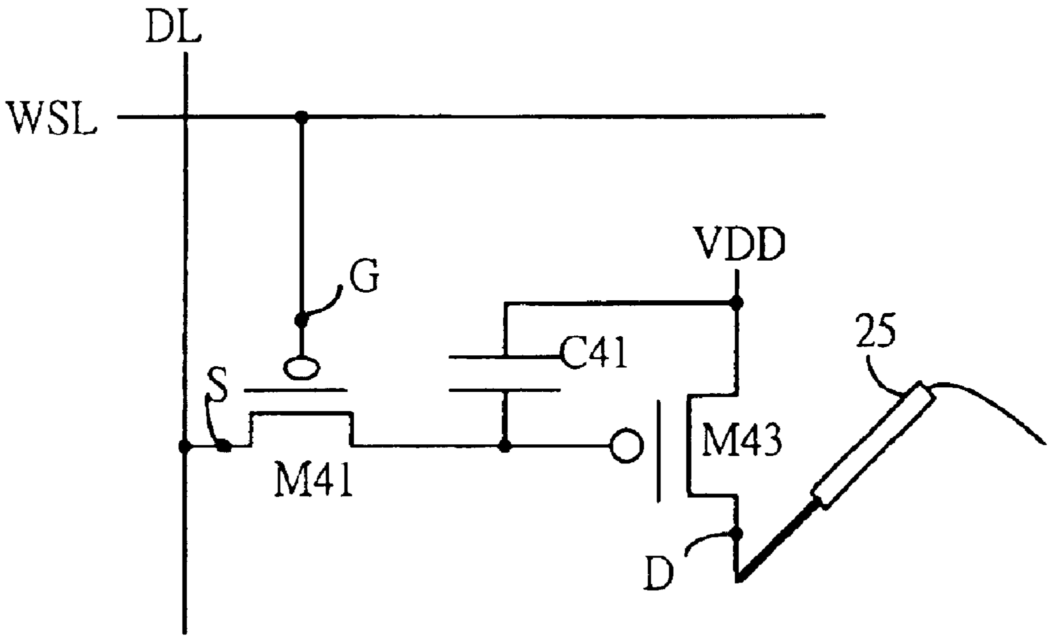
FIG. 4 illustrates the first circuitry before implantation of an OLED.

The present invention provides a method for testing the circuits within an AMOLED prior to implantation of OLEDs. The AMOLED has a plurality of circuits used to drive a plurality of OLEDs. The AMOLED further includes an input panel, a write scan line and a data line. The input pad is configured to input a selection signal for selecting a circuit and to input a data signal to make the OLED luminous after the OLED has been implanted into the circuit. The write scan line which receives the selection signal from the input panel is configured to enable or disable the circuit. The data line which receives the data signal from the input panel is configured to transmit the data signal to the circuit. FIG. 4 shows one of the common circuits prior to implantation of an OLED. With reference to FIG. 4, a circuit includes a first transistor M41 and a second transistor M43. The first transistor M41 and the second transistor M43 respectively include a source S, a gate G and a drain D. The source S, or the drain, of the first transistor M41 is connected to the data line DL of the AMOLED. The gate G of the first transistor M41 is connected to the write scan line WSL of the AMOLED. The drain D, or the source, of the second transistor M43 is a test output terminal which will be connected to an OLED after the OLED is implanted.

Figure 5:
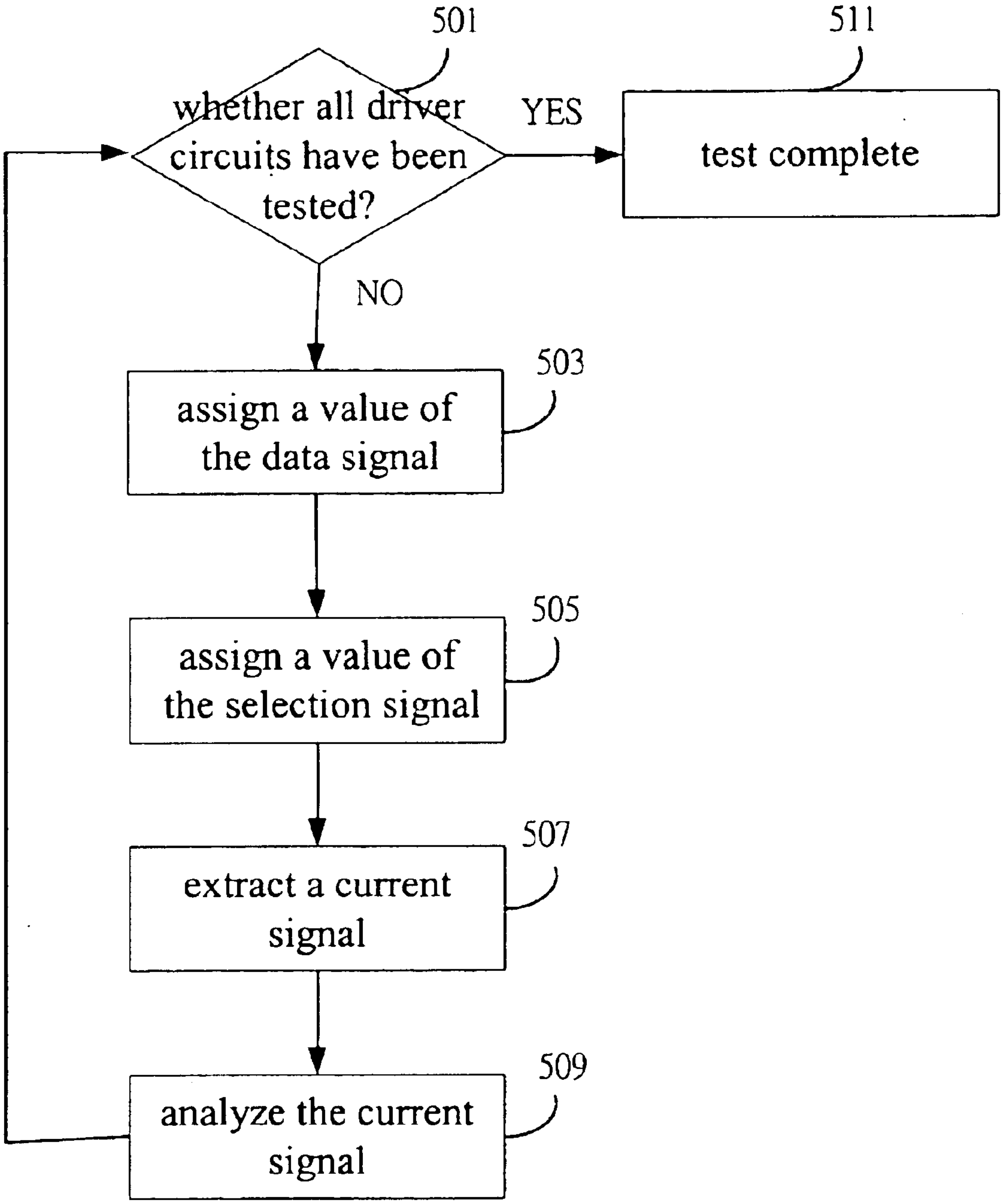
FIG. 5 illustrates the flow chart of the method provided by the present invention.

FIG. 5 shows the steps of the method provided by the present invention. In step 501, whether all circuits within the AMOLED have been tested is being checked. If the test is not complete, step 503 is executed, in which a value of the data signal is assigned to the data line DL via the input pad. In step 505, a value of the selection signal is assigned to the write scan line WSL via the input pad in order to select a circuit for test. For example, because the first transistor M41 of the circuit in FIG. 4 is a p-channel TFT, the write scan line WSL needs to transmit a low voltage level, in step 505, to the gate G of the first transistor M41 to turn on the first transistor M41. Once the first transistor M41 has been turned on, the data signal assigned in step 503 can enter the circuit. In step 507, a current signal is extracted from the test output terminal, i.e. the drain D, or the source, of the second transistor M43 shown in FIG. 4. In step 509, the current signal is analyzed to determine the normal functionality of the circuit. Then step 501 is executed again to check whether all circuits within the AMOLED have been tested. If still not, steps 503, 505, 507 and 509 are repeated. If yes, step 511 is executed to finish the whole test process.

For the circuit in FIG. 4, if the initial settings of the power supply VDD and the write scan line WSL are respectively 12V and 0V, the first transistor M41 can be turned on, i.e. the circuit is enabled, so that the data signal is able to enter the circuit. The data signal is a voltage value within a range from 7V to 10V. This range is divided into 64 gray scales in order to drive OLEDs to emit light at 64 different luminous levels. If the circuit can operate perfectly, the expected range of the extracted current signal should be from 20 μA to 0.002 μA. Also, the range between 20 μA and 0.002 μA, corresponding to the range of the data signal, can be divided into 64 gray scales. In step 503, the data signal is selected from any of the 64 gray scales within the range from 7V to 10V. If the circuit can operate perfectly, then the level of the current signal extracted in step 507 should fall in the corresponding gray scale.

Using the method of the present invention, testing the circuits of an AMOLED can be accomplished precisely and efficiently, and can evade diverse test results caused by subjective decisions of test engineers.

Figure 6:
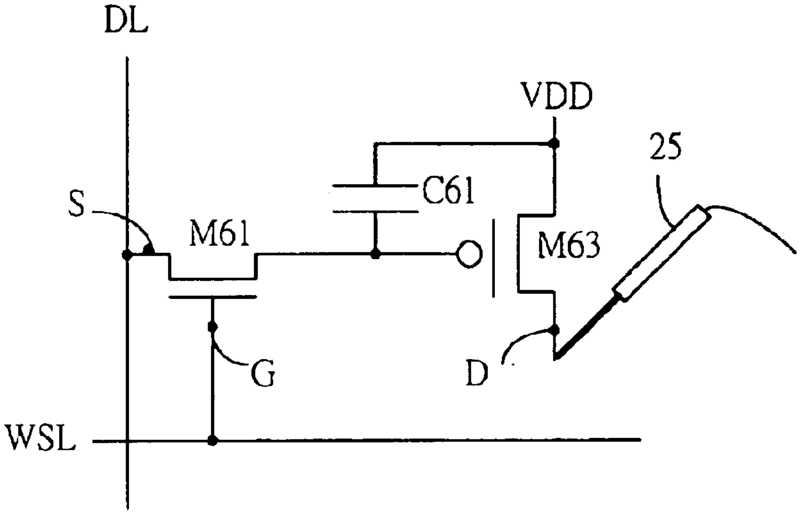
FIG. 6 illustrates the second circuitry before implantation of an OLED.
Figure 7:
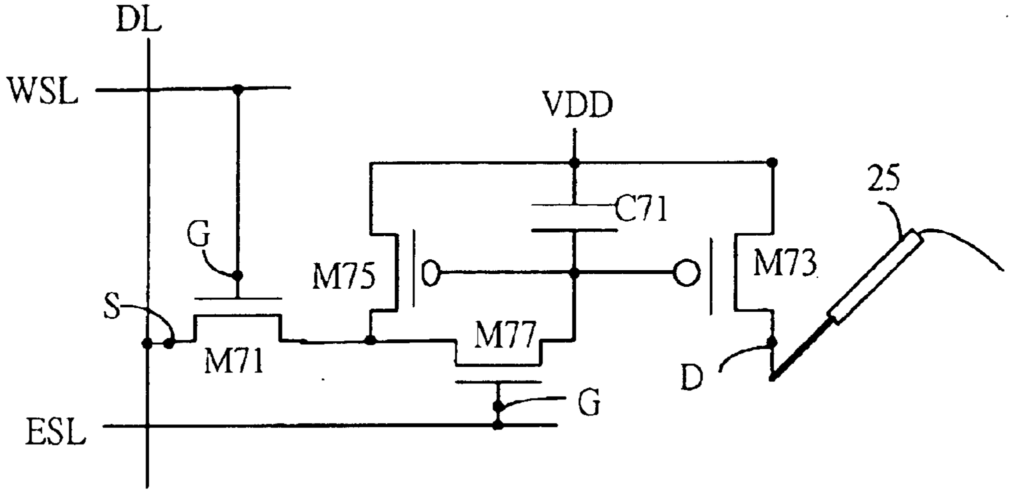
FIG. 7 illustrates the third circuitry before implantation of an OLED.

The circuits shown in FIG. 6 and FIG. 7 are also well known. The difference between those and the circuit shown in FIG. 4 is the types of the first transistors. More specifically, the first transistors M61 and M71 in FIG. 6 and FIG. 7 are n-channel TFTs, but the first transistor M41 in FIG. 4 is a p-channel TFT. Accordingly, the data signal in the write scan line WSL to enable the circuits shown in FIG. 6 and FIG. 7 should be assigned a high voltage level. Besides, the AMOLED with the circuits in FIG. 7 further includes an erase scan line ESL configured to eliminate the potential stored in the capacitor C71 before the data signal enters.

The method of the present invention can effectively test not only the circuits shown in FIG. 4, FIG. 6, and FIG. 7 but also other similar circuits not mentioned herein.

Figure 8:
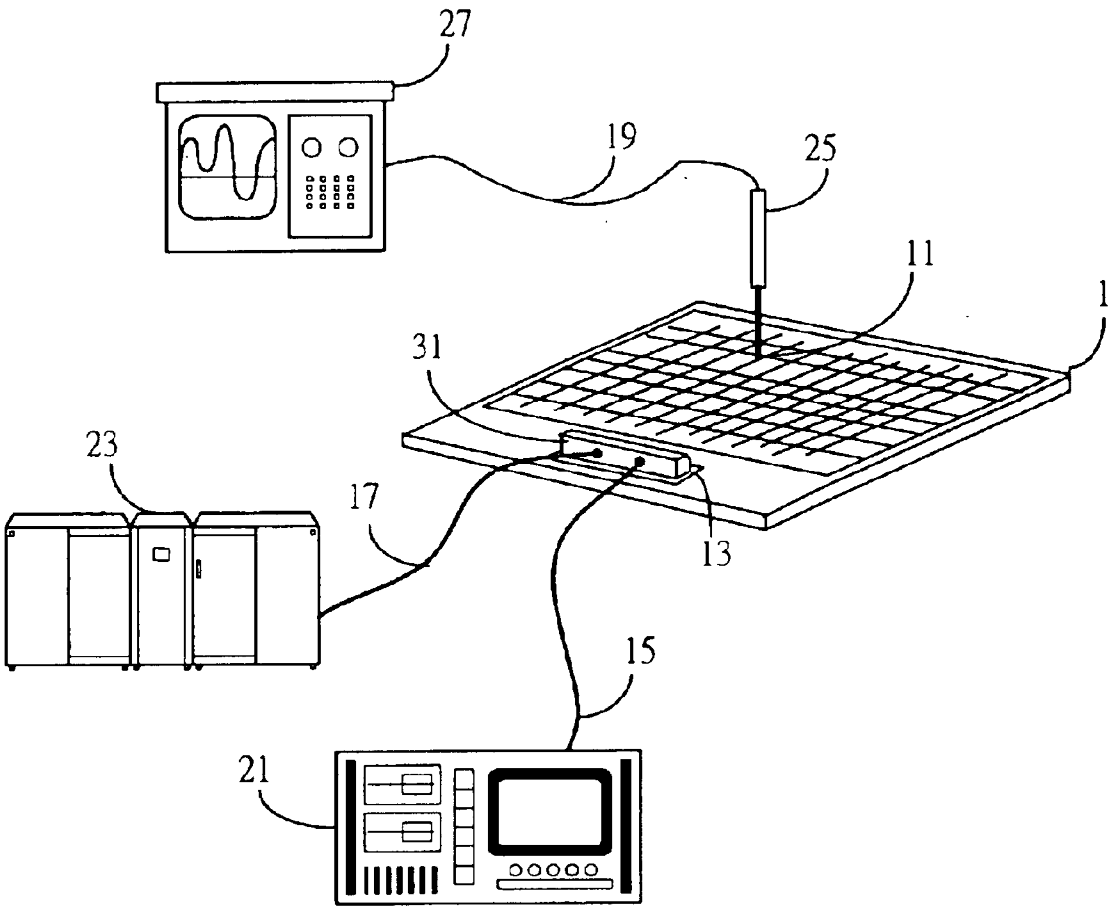
FIG. 8 illustrates the first exemplary embodiment of the system provided by the present invention.

The present invention also discloses a system configured to execute the above test method. As FIG. 8 shows, the system includes a data input device 21, a pixel selection device 23, a signal extractor 25 and a signal analyzer 27. The data input device 21 for inputting a value of the data signal 15 is connected to an input pad 13 via a connector 31. The pixel selection device 23 for inputting a value of the selection signal 17 is also connected to the input pad 13 via the connector 31 in order to select a circuit 11. The signal extractor 25 is connected to the test output terminal of the circuit 11 and is configured to extract a current signal 19 from the circuit 11. The signal analyzer 27, connected to the signal extractor 25, is configured to analyze the current signal 19 to determine the normal functionality of the circuit 11.

Figure 9:
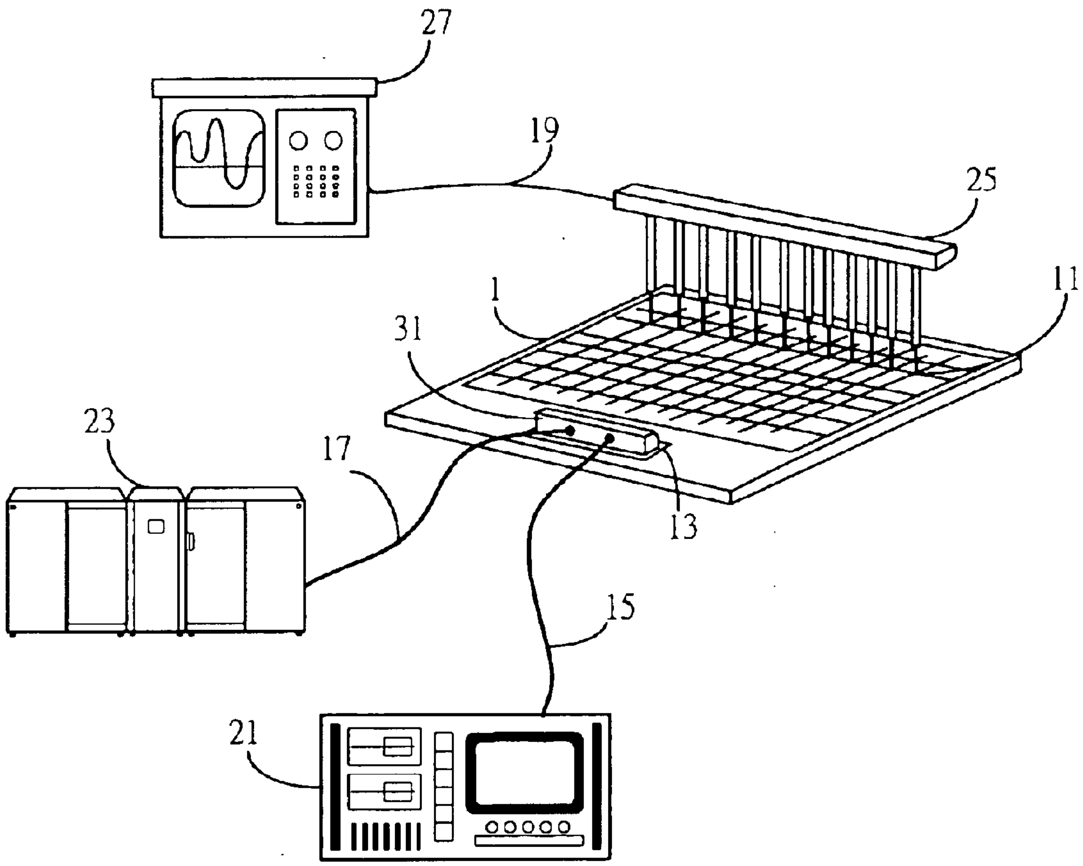
FIG. 9 illustrates the second exemplary embodiment of the system provided by the present invention.

With reference to FIG. 8, the signal extractor 25 includes a single test pin. To test the circuit 11, the signal extractor 25 needs moving onto the test output terminal of the circuit 11. FIG. 9 illustrates another exemplary embodiment of the system provided by the present invention. The signal extractor 25 shown in FIG. 9 is capable of testing a row of circuits 11 at one time with its plural test pins. In addition, the signal extractor 25 can also be designed as a test pin array with which all circuits can be tested without the signal extractor 25 being moved.

The above description of the preferred embodiments is expected to clearly expound the characteristics of the present invention but not expected to restrict the scope of the present invention. Those skilled in the art will readily observe that numerous modifications and alterations of the apparatus may be made while retaining the teaching of the invention. Accordingly, the above disclosure should be construed as limited only by the bounds of the claims.

I claim:

1. A method for testing a plurality of circuits of an active matrix organic light emitting display (AMOLED), the AMOLED comprising a write scan line configured to enable a circuit to be tested responsive to a selection signal and a data line configured to transmit a data signal to the circuit, the circuit comprising a first transistor and a second transistor respectively comprising a source, a gate and a drain, the source or the drain of the first transistor is connected to the data line, the gate of the first transistor is connected to the write scan line, the drain or the source of the second transistor being a test output terminal and being directly connected to a signal extractor, the method comprising the following steps prior to implantation of organic light emitting diodes (OLED):

assigning a value of the data signal to the write scan line;

assigning a value of the selection signal to the data line; and extracting a signal from the test output terminal.

2. The method of claim 1, wherein the step of assigning a value of the data signal is to assign a voltage value within a range of 7V~10V, and the step of extracting a signal is to extract a current signal.

3. The method of claim 2, wherein the normal functionality of the circuit is concluded if the current signal is between 20 μA~0.002 μA.

4. A system for testing a plurality of circuits of an AMOLED, the AMOLED comprising a write scan line configured to enable a circuit to be tested responsive to a selection signal and a data line configured to transmit a data signal to the circuit, the circuit comprising a first transistor and a second transistor respectively comprising a source, a gate and a drain, the source or the drain of the first transistor is connected to the data line, the gate of the first transistor is connected to the write scan line, the drain or the source of the second transistor being a test output terminal and being directly connected to a signal extractor, the system comprising:

a data input device for inputting a value of the data signal prior to implantation of organic light emitting diodes (OLED);

a pixel selection device for inputting a value of the selection signal prior to implantation of organic light emitting diodes (OLED); and a signal extractor, connected to the test output terminal, for extracting a signal prior to implantation of organic light emitting diodes (OLED).

* * * * *